(12) United States Patent
Sugimae et al.

(10) Patent No.: US 8,049,267 B2
(45) Date of Patent: Nov. 1, 2011

(54) SEMICONDUCTOR DEVICE AND METHOD OF MANUFACTURING THE SAME

(75) Inventors: Kikuko Sugimae, Kanagawa-ken (JP); Yasushi Kameda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 12/479,473

(22) Filed: Jun. 5, 2009

(65) Prior Publication Data

US 2009/0303797 A1 Dec. 10, 2009

(30) Foreign Application Priority Data

Jun. 5, 2008 (JP) ................................. 2008-147843

(51) Int. Cl.
*H01L 29/788* (2006.01)
*G11C 11/34* (2006.01)
(52) U.S. Cl. .................................. 257/316; 365/185.23
(58) Field of Classification Search .................. 257/316
See application file for complete search history.

(56) References Cited

U.S. PATENT DOCUMENTS

| | | | |
|---|---|---|---|
| 4,808,550 A * | 2/1989 | Fukushima | 438/427 |
| 6,291,307 B1 * | 9/2001 | Chu et al. | 438/393 |
| 6,872,614 B2 * | 3/2005 | Fujiwara | 438/201 |
| 7,196,932 B2 * | 3/2007 | Takeuchi et al. | 365/185.21 |
| 7,545,004 B2 * | 6/2009 | Yang et al. | 257/369 |
| 7,847,222 B2 * | 12/2010 | Guha et al. | 219/553 |
| 2007/0108509 A1 * | 5/2007 | Hashidzume et al. | 257/324 |
| 2009/0174465 A1 | 7/2009 | Sato | |

FOREIGN PATENT DOCUMENTS

| | | |
|---|---|---|
| JP | 2003-197781 | 7/2003 |
| JP | 2007-27666 | 2/2007 |

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

A semiconductor device includes a semiconductor substrate, a gate insulating film formed on the substrate, a first gate electrode formed on the gate insulating film, source and drain regions formed in the substrate so as to sandwich the first gate electrode, an intergate insulating film formed on the first gate electrode and including an opening, a second gate electrode formed on the intergate insulating film and electrically connected to the first gate electrode through the opening, and a boost electrode formed on the intergate insulating film and electrically isolated from the first gate electrode and the second gate electrode.

17 Claims, 9 Drawing Sheets

US 8,049,267 B2

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2008-147843, filed Jun. 5, 2008, the entire contents of which are incorporated herein by reference.

BACKGROUND OF THE INVENTION

1. Field of the Invention

The present invention relates to a semiconductor device and a method of manufacturing the same. More specifically, the present invention relates to a structure and a manufacturing method of a transistor used in a peripheral circuit for supplying a predetermined voltage to a memory cell transistor.

2. Description of the Background Art

In general, a memory cell transistor in a non-volatile semiconductor memory includes a gate insulating film referred to as a tunnel insulating film, a floating gate electrode functioning as a charge accumulation layer, an intergate insulating film, a control gate electrode, and the like. The non-volatile semiconductor memory charges electrons in the floating gate electrode by applying a high voltage to the control gate electrode and feeding a tunnel current to the tunnel insulating film. In this way, data are written in the memory cell transistor.

Usually, a high write voltage (Vpp) ranging from 15V to 25V is necessary for the tunnel current flowing to the tunnel insulating film. The write voltage is transferred from a transfer gate transistor to the memory cell transistor and then applied to the control gate electrode.

In general, the transfer gate transistor includes a gate insulating film, a first gate electrode, an intergate insulating film having an opening, a second gate electrode, and the like. The first gate electrode is electrically connected to the second gate electrode through the opening in the intergate insulating film. Usually, the transfer gate transistor is formed simultaneously with the memory cell transistor. Accordingly, the gate insulating film, the first gate electrode, the intergate insulating film, and the second gate electrode of the transfer gate transistor are generally formed of identical layers to those of the gate insulating film, the floating gate electrode, the intergate insulating film, and the control gate electrode of the memory cell transistor, respectively.

The transfer gate transistor has to transfer the write voltage Vpp to the source. Accordingly, it is necessary to apply the write voltage Vpp to the drain and to apply a voltage equivalent to a sum of the write voltage Vpp and a threshold voltage Vth of the transfer gate transistor to the second gate electrode. For this reason, the non-volatile semiconductor memory as described above requires a large charge pump circuit for generating such a high voltage as Vpp+Vth.

Japanese Patent Application Publication No. 2007-27666 describes an example of a non-volatile semiconductor storage device. FIG. 3, FIG. 4, and FIG. 5 in JP 2007-27666 disclose examples of cross-sectional structures of a memory cell transistor, a low voltage transistor, and a high voltage transistor, respectively.

BRIEF SUMMARY OF THE INVENTION

A semiconductor memory device according to an exemplary aspect of the present invention includes a semiconductor substrate; a first gate insulating film formed on the substrate; a first gate electrode formed on the first gate insulating film; source and drain regions formed in the substrate so as to sandwich the first gate electrode; a first intergate insulating film formed on the first gate electrode and including an opening; a second gate electrode formed on the first intergate insulating film and electrically connected to the first gate electrode through the opening; and a boost electrode formed on the first intergate insulating film and electrically isolated from the first gate electrode and the second gate electrode.

A method of manufacturing a semiconductor memory device according to an exemplary aspect of the present invention includes forming a gate insulating film on a substrate; forming a first gate electrode on the gate insulating film; forming an intergate insulating film on the first gate electrode; forming an opening in the intergate insulating film; forming an electrode layer on the intergate insulating film having the opening formed therein; forming a groove in the electrode layer so as to form the electrode layer into a second gate electrode and a boost electrode, the second gate electrode being electrically connected to the first gate electrode through the opening, the boost electrode being electrically insulated from the first gate electrode and separated from the second gate electrode by the groove; forming source and drain regions in the substrate so as to sandwich the first gate electrode between the source and drain regions; and embedding an insulating film into the groove so as to electrically insulate the second gate electrode from the boost electrode.

DETAILED DESCRIPTION OF PREFERRED EMBODIMENTS

Embodiments of the present invention will now be described with reference to the accompanying drawings.

Figure 1:
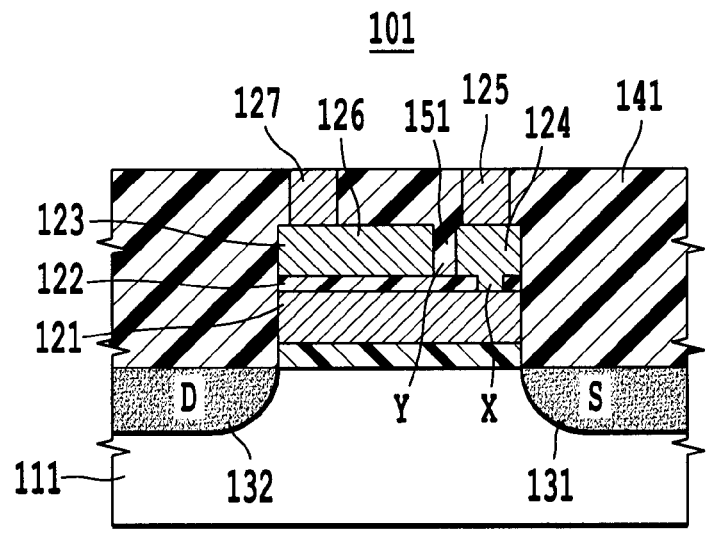
FIG. 1 is a side cross-sectional view of a semiconductor device according to a first exemplary embodiment of the present invention.

FIG. 1 is a side cross-sectional view of a semiconductor device 101 according to a first exemplary embodiment of the present invention. The semiconductor device 101 shown in FIG. 1 is a transfer gate transistor in a non-volatile semiconductor memory which includes a memory cell transistor. FIG. 1 corresponds to the side cross-sectional view of a transfer gate transistor that includes the non-volatile semiconductor memory.

FIG. 1 illustrates a substrate 111, a gate insulating film 121, a first gate electrode 122, an intergate insulating film 123, a second gate electrode 124, a contact plug 125 dedicated to the second gate electrode 124, a boost electrode 126, a contact plug 127 dedicated to the boost electrode 126, source and drain regions 131 and 132, and an interlayer insulating film 141.

Here, the substrate 111 is a semiconductor substrate, for example a silicon substrate. The substrate 111 may also be a SOI (semiconductor on insulator) substrate. The source and drain regions 131 and 132 are formed in the substrate 111 so as to sandwich the first gate electrode 122.

The gate insulating film 121 is formed on the substrate 111. Here, the gate insulating film 121 can be a silicon oxide film. The first gate electrode 122 is formed on the gate insulating film 121. Here, the first gate electrode 122 can be a polysilicon layer.

The intergate insulating film 123 is formed on the first gate electrode 122. The intergate insulating film 123 is provided with an opening X. The opening X penetrates the intergate insulating film 123 and reaches the first gate electrode 122. Here, the intergate insulating film 123 can be a high-k insulating film. Alternatively, the intergate insulating film 123 may be any of a silicon oxide film, a silicon nitride film, or an ONO stacked film. When the intergate insulating film 123 is the high-k insulating film, an effect of boosting efficiency of the boost electrode 126 is higher.

Both of the second gate electrode 124 and the boost electrode 126 are formed on the intergate insulating film 123. The second gate electrode 124 is electrically connected to the first gate electrode 122 through the opening X. The second gate electrode 124 is electrically connected to the contact plug 125 located on the second gate electrode 124. On the other hand, the boost electrode 126 is electrically insulated from the first gate electrode 122 and the second gate electrode 124. The boost electrode 126 is electrically connected to the contact plug 127 located on the boost electrode 126.

The second gate electrode 124 and the boost electrode 126 are separated from each other by a groove Y, which is formed between the second gate electrode 124 and the boost electrode 126, and are electrically insulated from each other by an insulating film 151 that is embedded in the groove Y. The insulating film 151 can constitute part of the interlayer insulating film 141. Here, the interlayer insulating film 141 can be a silicon oxide film. The insulating film 151 may be either part of the interlayer insulating film 141 or an insulating film provided separately from the interlayer insulating film 141. It is to be noted that the former configuration of the insulating film 151 being part of the interlayer insulating film 141 involves a simpler manufacturing process than the latter configuration.

Here, the second gate electrode 124 and the boost electrode 126 can be formed of the same electrode layer and have the same film thickness. The electrode layer can be either a polysilicon layer or a metal layer such as a W (tungsten) layer, a Pt (platinum) layer, or an Al (aluminum) layer. Any of these electrode layers may include a silicide layer such as a nickel silicide layer or a cobalt silicide layer to be formed either on an upper part or on the entire part thereof. The second gate electrode 124 and the boost electrode 126 may be formed either by using the same electrode layer or by using mutually different electrode layers. It is to be noted that the former configuration of the second gate electrode 124 and the boost electrode 126 formed by the same electrode layer involves a simpler manufacturing process than the latter configuration.

Figure 2:
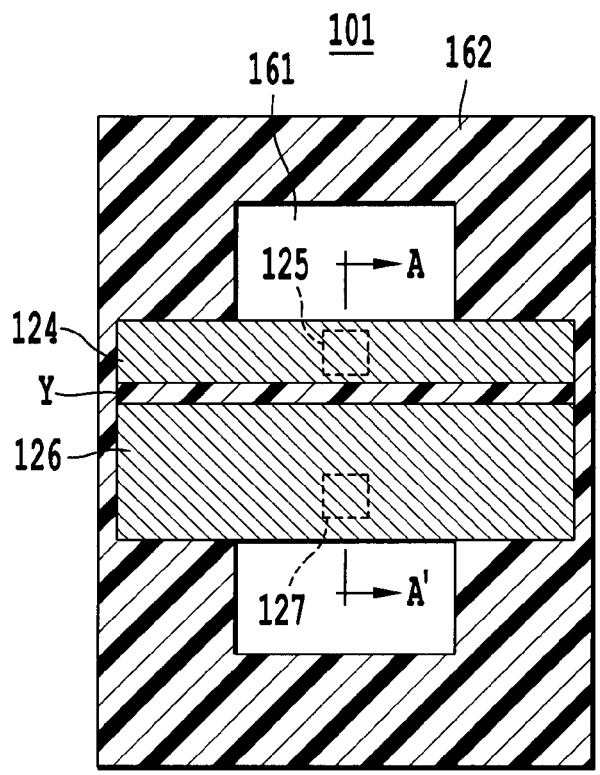
FIG. 2 is a plan view of the semiconductor device of FIG. 1.

FIG. 2 is a plan view of the semiconductor device 101 of FIG. 1. FIG. 1 corresponds to the cross-sectional view taken along the A-A' line in FIG. 2. As shown in FIG. 2, a device region 161 is surrounded by a device isolation region 162. Moreover, as shown in FIG. 2, the second gate electrode 124 and the boost electrode 126 described above are formed on the device region 161 so as to intersect the device region 161. Further, as shown in FIG. 2, the groove Y separates the second gate electrode 124 from the boost electrode 126.

A boost ratio is calculated as follows. A capacity of the intergate insulating film 123 interposed between the boost electrode 126 and the first gate electrode 122 is defined as C1 while a capacity of the gate insulating film 121 interposed between the first gate electrode 122 and the semiconductor substrate 111 is defined as C2. In this case, a boost ratio CP is expressed by $CP=C1/(C1+C2)$. The capacities C1 and C2 increase in proportion to an area of the intergate insulating film 123 interposed between the boost electrode 126 and the first gate electrode 122 and to an area of the gate insulating film 121 interposed between the first gate electrode 122 and the semiconductor substrate 111, respectively.

Specifically, assuming that an area ratio between the first gate electrode 122 and the boost electrode 126 is defined as x:y, it is preferable to set a value of y/x as large as possible because boosting efficiency of the boost electrode 126 becomes higher as the value of y/x is larger. Therefore, it is preferable to set an area ratio of the second gate electrode 124 on the first gate electrode 122 as low as possible while it is preferable to set an area ratio of the boost electrode 126 on the first gate electrode 122 as high as possible. The second gate electrode 124 only needs to have an area that is large enough for forming the contact plug 125 thereon. An example of the semiconductor device 101 having the second gate electrode 124 having the above-described configuration is shown in FIG. 3.

Figure 3:
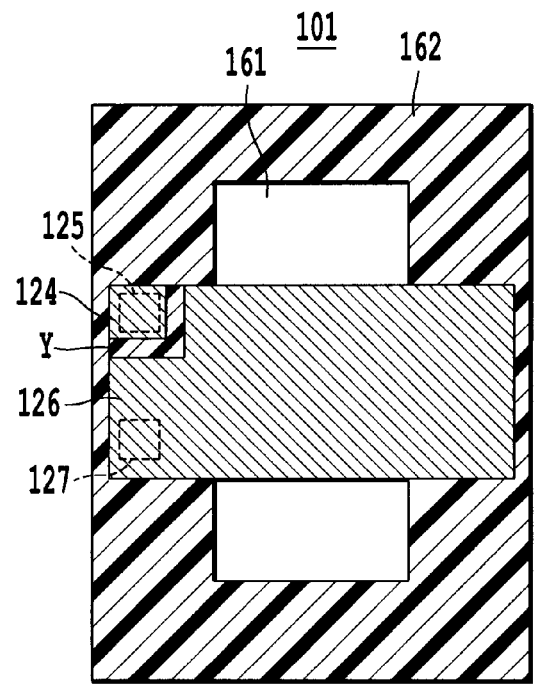
FIG. 3 is a plan view of the semiconductor device of FIG. 1 with a modification.

As shown in FIG. 3, the area of the second gate electrode 124 takes into account the area of the contact plug 125 as well as displacement of the contact plug 125 attributable to process variations. Moreover, the second gate electrode 124 is formed on a corner on the first gate electrode 122 and is surrounded on two sides thereof by the groove Y. By applying this structure, it is possible to minimize the area of the groove Y while increasing the area of the boost electrode 126. Meanwhile, the contact plugs 125 and 127 are formed on the device isolation region 162. By applying this configuration, it is possible to reduce damages on the gate insulating film 121 when the contact plugs 125 and 127 are processed by RIE (reactive ion etching), for example.

Figure 4:
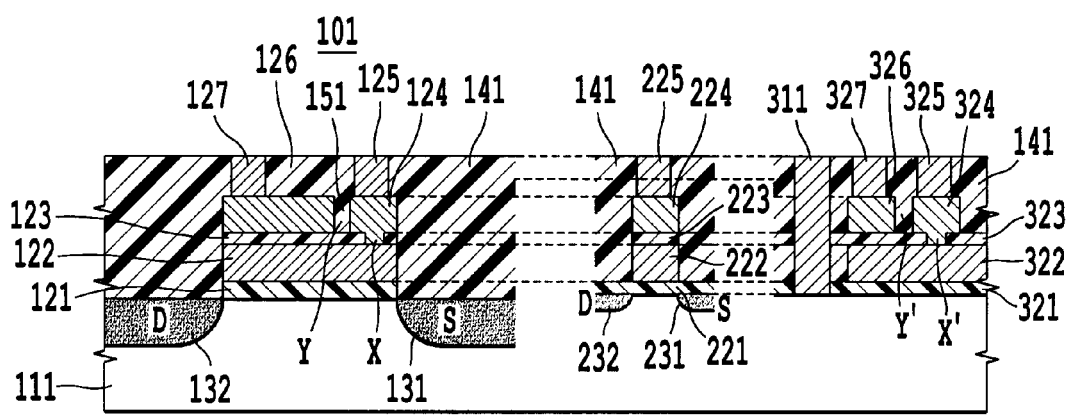
FIG. 4 is another side cross-sectional view of the semiconductor device of FIG. 1.

FIG. 4 is another side cross-sectional view of the semiconductor device 101 of FIG. 1. The side cross-sectional view of FIG. 4 illustrates a memory cell transistor and a capacitor element in addition to the transfer gate transistor.

In addition to the constituents shown in FIG. 1, FIG. 4 illustrates a gate insulating film 221 which is referred to as a tunnel insulating film, a floating gate electrode 222 that functions as a charge accumulation layer, an intergate insulating film 223, a control gate electrode 224, a contact plug 225 dedicated to the control gate electrode 224, and source and drain regions 231 and 232.

The gate insulating film 221 is formed on the semiconductor substrate 111. Here, the gate insulating film 221 can be made of the same insulating film as the gate insulating film 121 or made of the same material as part of the gate insulating film 121. Accordingly, the gate insulating film 221 can be the silicon oxide film in this case.

The floating gate electrode 222 is formed on the gate insulating film 221. Here, the floating gate electrode 222 can be made of the same electrode layer as the first gate electrode 122. Accordingly, the floating gate electrode 222 can be the polysilicon layer in this case.

The intergate insulating film 223 is formed on the floating gate electrode 222. Here, the intergate insulating film 223 can be made of the same insulating film as the intergate insulating film 123. Accordingly, the intergate insulating film 223 can be the high-k insulating film in this case.

The control gate electrode 224 is formed on the intergate insulating film 223. Here, the control gate electrode 224 can be made of the same electrode layer as the second gate electrode 124. Accordingly, the control gate electrode 224 can be any of the polysilicon layer or the metal layer such as the W layer, the Pt layer, or the Al layer.

The source and drain regions 231 and 232 are formed in the substrate 111 so as to sandwich the floating gate electrode 222.

The side cross-sectional view in FIG. 4 also illustrates the capacitor element. The capacitor element in FIG. 4 includes a lower insulating film 321, a lower electrode 322, an upper insulating film 323, a lower connection electrode 324, and an upper electrode 326. Moreover, FIG. 4 illustrates a contact plug 325 connected to the lower connection electrode 324, a contact plug 327 connected to the upper electrode 326, and a contact plug 311 connected to the semiconductor substrate 111.

In FIG. 4, the lower insulating film 321 is formed on the semiconductor substrate 111. The lower electrode 322 is formed on the lower insulating film 321. The upper insulating film 323 is formed on the lower electrode 322. The upper insulating film 323 is provided with an opening X'. The opening X' penetrates the upper insulating film 323 and reaches the lower electrode 322. Both of the lower connection electrode 324 and the upper electrode 326 are formed on the upper insulating film 323. The lower connection electrode 324 is electrically connected to the lower electrode 322 through the opening X'. The upper electrode 326 is electrically insulated from the lower electrode 322 and the lower connection electrode 324. The lower connection electrode 324 and the upper electrode 326 are separated from each other by a groove Y', which is formed between the lower connection electrode 324 and the upper electrode 326, and are electrically insulated from each other by an insulating film (the interlayer insulating film 141 in this case) that is embedded in the groove Y'.

In FIG. 4, the lower connection electrode 324 is electrically connected to the contact plug 325 that is provided on the lower connection electrode 324. The upper electrode 326 is electrically connected to the contact plug 327 that is provided on the upper electrode 326. The semiconductor substrate 111 is electrically connected to the contact plug 311 provided on the semiconductor substrate 111. In this embodiment, 5 V is applied to the contact plug 325 while 0 V is applied to the contact plugs 327 and 311. In this way, the capacitor element in FIG. 4 functions as a capacitor element that employs the upper insulating film 323 interposed between the upper electrode 326 and the lower electrode 322 as well as the lower insulating film 321 interposed between the lower electrode 322 and the semiconductor substrate 111 as the insulating films for accumulating electric charges.

Here, the lower insulating film 321 can be made of the same insulating film as or part of the gate insulating film 121 in this case. Meanwhile, the lower electrode 322 can be made of the same electrode layer as the first gate electrode 122 in this case. Meanwhile, the upper insulating film 323 can be made of the same insulating film as the intergate insulating film 123 in this case. Meanwhile, the lower connection electrode 324 and the upper electrode 326 can be made of the same electrode layer as the second gate electrode 124 and the boost electrode 126 in this case. Here, the lower connection electrode 324 and the upper electrode 326 can be made of the same electrode layer and have the same film thickness.

Unlike the memory cell transistor or the transfer gate transistor, no source and drain regions configured to sandwich—the lower electrode 322 are formed in the semiconductor substrate 111 in the vicinity of the capacitor element.

Figure 5:
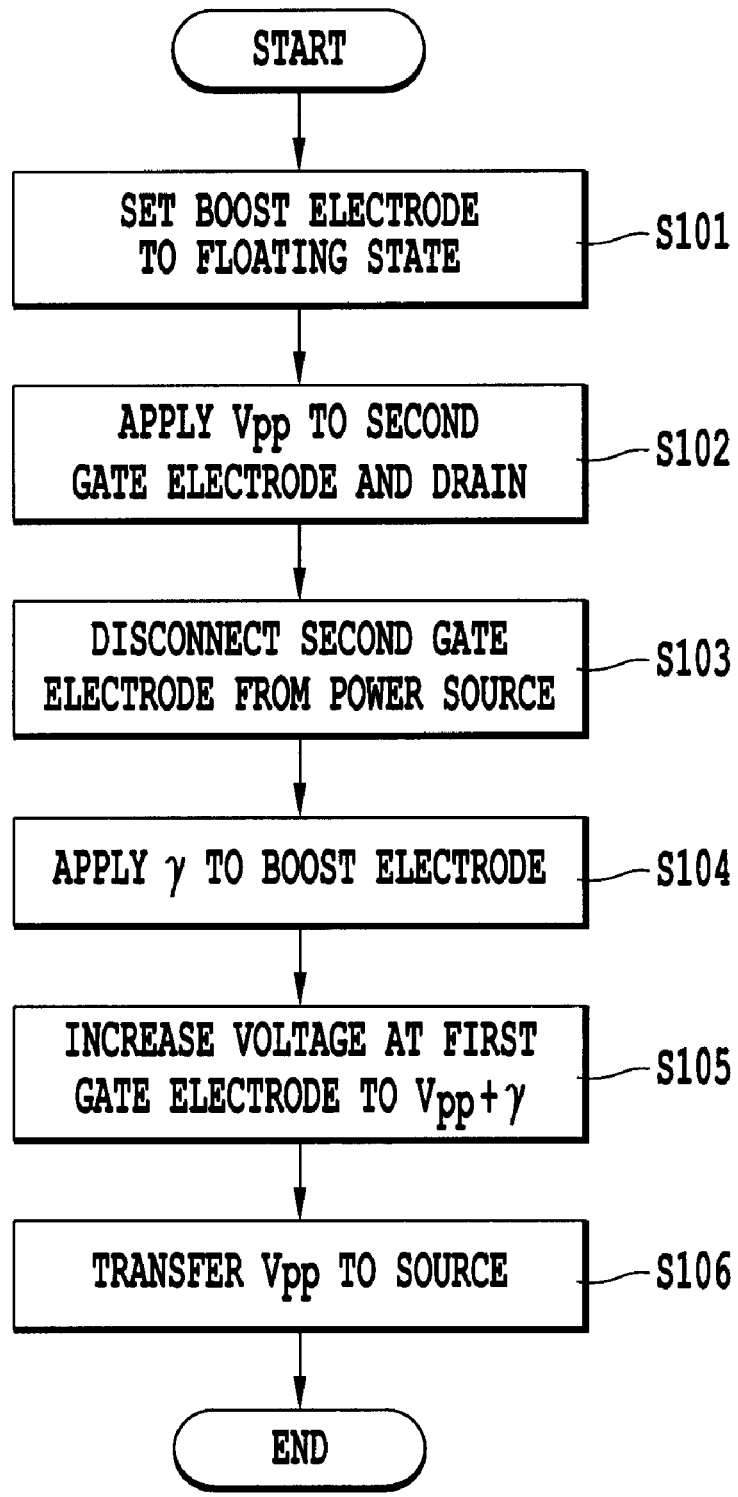
FIG. 5 is a flowchart for explaining operations of the semiconductor device of FIG. 1.

FIG. 5 is a flowchart for explaining operations of the semiconductor device 101 of FIG. 1. FIG. 5 shows a flow of operations for transferring a write voltage from the drain 132 to the source 131 of the transfer gate transistor.

In an initial state, the boost electrode 126 is set to a floating state (S101).

Next, a programming voltage Vpp is applied to the second gate electrode 124 and the drain 132 (S102). The programming voltage Vpp represents an example of a first voltage. The programming voltage Vpp applied to the second gate electrode 124 is transferred to the first gate electrode 122 through the opening X.

Next, the second gate electrode 124 is disconnected from a power source after application of the write voltage Vpp (S103).

Next, a voltage a is applied to the boost electrode 126 (S104) in the state that the second gate 124 is disconnected from the power source. Specifically, the voltage at the boost electrode 126 is swept from 0 [V] to α[V]. Here, the voltage a is defined as a voltage around a threshold voltage Vth of the transfer gate transistor. The voltage α represents an example of a second voltage.

By performing the operation in S104, the voltage at the first gate electrode 122 is increased to a voltage Vpp+α, which is equal to a sum of the write voltage Vpp and the voltage α (S105). As a consequence, the programming voltage Vpp is transferred to the source 131 (S106). The voltage Vpp+α represents an example of a third voltage.

Here, in S101 (the initial state), it is possible to set the voltage at the boost electrode 126 to 0 [V] or to a value between 0 [V] and α[V]. In the latter case, the value of the voltage can be set to α/2 [V], for example. In this case, the voltage at the boost electrode 126 is swept from α/2 [V] to α[V] in S104. Here, it is possible to stabilize the increase in the voltage at the first gate electrode 122 in S105 by applying the voltage to the boost electrode 126 in S101 (the initial state).

By applying the above-described configuration, this embodiment can reduce a maximum voltage to be generated by a charge pump circuit from Vpp+Vth down to Vpp. In other words, this embodiment can reduce the maximum voltage supplied to the transfer gate transistor. Accordingly, in this embodiment, it is possible to shrink the charge pump circuit and thereby to reduce a circuit area of the semiconductor device.

The transfer gate transistor of this embodiment may be formed simultaneously with the memory cell transistor. Moreover, the transfer gate transistor of this embodiment may also be formed simultaneously with a capacitor. These possibilities contribute to simplification of the manufacturing process of the semiconductor device. In this embodiment, the size of the boost electrode 126 is restricted due to existence of the second gate electrode 124. Nevertheless, in this embodiment, it is possible to obtain a sufficient boosting effect by providing a sufficient gate length of the transfer gate transistor. The gate length of the transfer gate transistor of this embodiment can be set to 2 μm, for example.

Figure 6:
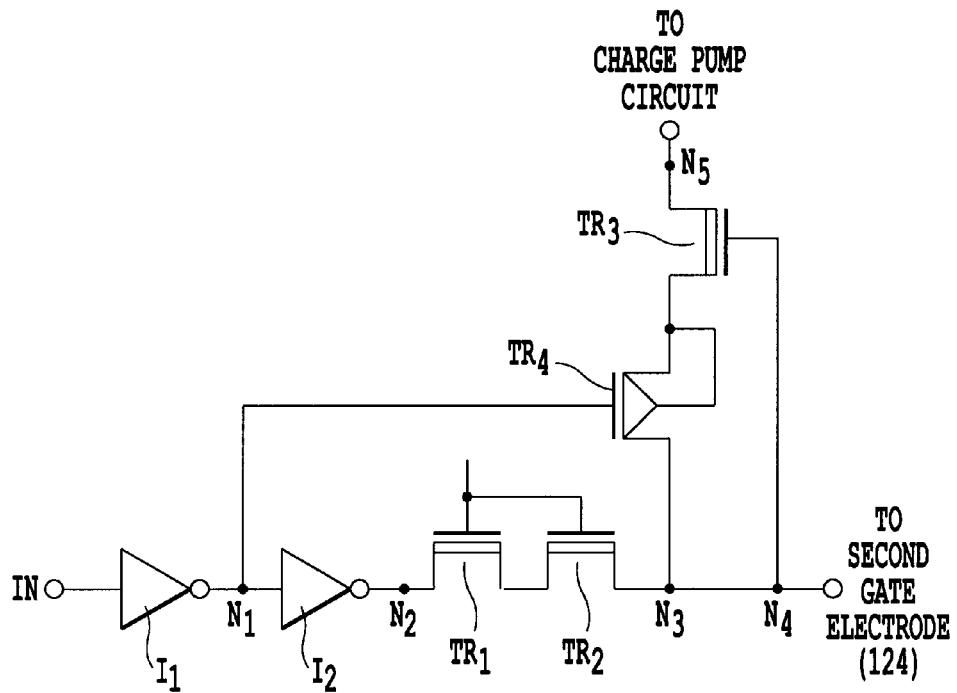
FIG. 6 is a diagram showing a circuit configuration example of a row main decoder.

FIG. 6 shows a circuit configuration example of a row main decoder that is provided between the second gate electrode 124 and the charge pump circuit.

The row main decoder of FIG. 6 includes a first inverter I1, a second inverter I2, a first transistor TR1, and a second transistor TR2, which are connected in series between an input terminal IN and the second gate electrode 124. Here, the first transistor TR1 can be a low breakdown voltage depression-type NMOS (negative channel metal oxide semiconductor). Meanwhile, the second transistor TR2 can be a high breakdown voltage depression-type NMOS. FIG. 6 shows a node N1 located between the first inverter I1 and the second inverter I2, a node N2 located between the second inverter I2 and the first transistor TR1, a node N3 located between the second transistor TR2 and the second gate electrode 124, and a node N4 located between the node N3 and the second gate electrode 124.

The row main decoder of FIG. 6 further includes a third transistor TR3 and a fourth transistor TR4, which are connected in series between the charge pump circuit and the node N3. Here, the third transistor TR3 can be a high breakdown voltage depression-type NMOS. Meanwhile, the fourth transistor TR4 can be a high breakdown voltage enhancement-type NMOS. A gate of the third transistor TR3 is connected to the node N4. A gate of the fourth transistor TR4 is connected to the node N1. FIG. 6 illustrates a node N5 located between the charge pump circuit and the third transistor TR3.

Now, operations of the semiconductor device 101 concerning the row main decoder of FIG. 6 will be described in conjunction with the flowchart of FIG. 5.

In S103, the second gate electrode 124 is disconnected from the power source. Specifically, the nodes N3 and N4 are set to the floating state. In S102, the charge pump circuit generates a predetermined voltage and then stops operation. Accordingly, in S103, the circuit beyond the node N5 is disconnected and set to the floating state. On the other hand, the node N2 is connected to the second inverter I2 and is not disconnected from the power source. Therefore, it is necessary to turn off the first and second transistors TR1 and TR2 in S103. Accordingly, the semiconductor device 101 turns off the transistors TR1 and TR2 by applying a negative voltage to gates of the transistors TR1 and TR2. In this way, the second gate electrode 124 is disconnected from the power source.

Alternatively, the semiconductor device 101 may turn off the transistors TR1 and TR2 even when the voltage at the gates of the transistors TR1 and TR2 is equal to 0 V by applying a positive voltage to a well potential of the transistors TR1 and TR2. In this case, it is possible to simplify the circuit configuration because it is not necessary to generate the negative voltage.

Figure 7:
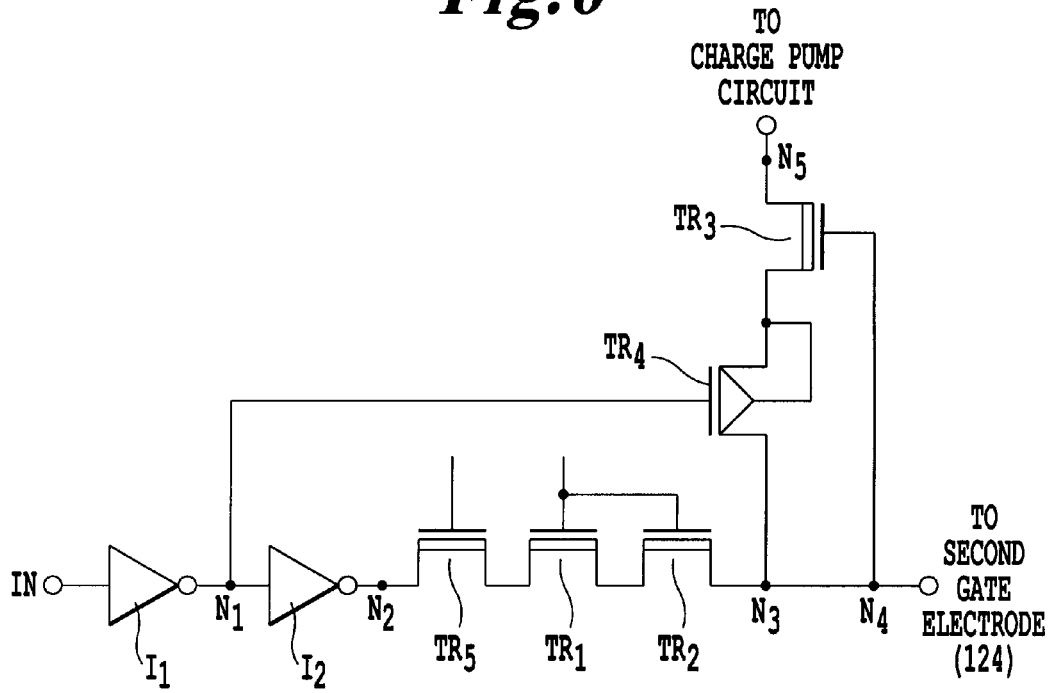
FIG. 7 is a diagram showing another circuit configuration example of a row main decoder with a modification.

FIG. 7 shows a modified example of the circuit configuration of FIG. 6. In FIG. 7, a fifth transistor TR5 is disposed between the node N2 and the first transistor TR1. Here, the fifth transistor TR5 can be a low breakdown voltage enhancement-type NMOS. In FIG. 7, it is possible to set the nodes N3 and N4 to the floating state by setting a gate of the fifth transistor TR5 to 0 V (turning off the fifth transistor TR5). As a consequence, it is not necessary to separate the well potential of the transistors TR1 and TR2 from other transistor wells because the well potential of the transistor TR1 and TR2 does not have to be changed.

Here, the charge pump circuit shown in FIG. 6 or FIG. 7 generates a voltage Vpp+Δ when applying the voltage Vpp to the second gate electrode 124. This Δ value is appropriately adjusted so that the voltage Vpp is applied to the second gate 124.

FIGS. 8 to 14 are manufacturing process diagrams of the semiconductor device 101 of the first embodiment.

Figure 8:
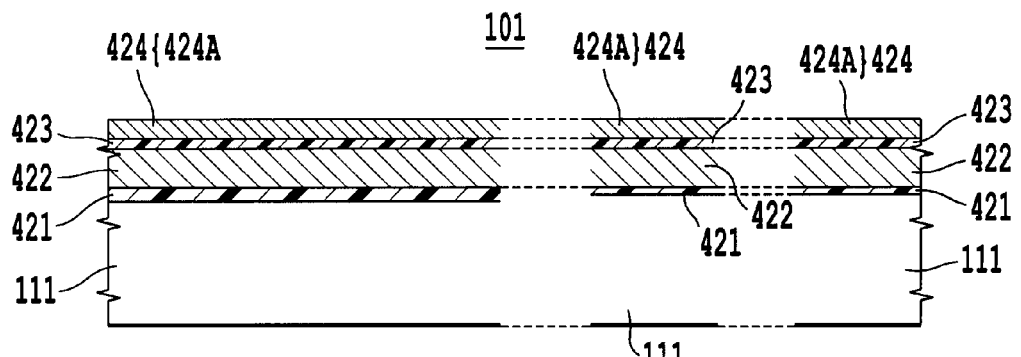
FIG. 8 is a manufacturing process diagram of the semiconductor device of the first embodiment.

As shown in FIG. 8, a first insulating film 421 is formed on the substrate 111. The substrate 111 can be a silicon substrate in this case. The first insulating film 421 can be a silicon oxide film in this case. The first insulating film 421 is formed, for example, by depositing a first oxide film on the substrate 111 by oxidation, then removing the first oxide film outside a transfer gate transistor region by lithography and etching, and then depositing a second oxide film on the substrate 111 again by oxidation. As shown in FIG. 8, a first electrode layer 422 is formed on the first insulating film 421 by chemical vapor deposition (CVD), for example. The first electrode layer 422 can be a polysilicon layer in this case. As shown in FIG. 8, a second insulating film 423 is formed on the first electrode layer 422 by CVD, for example. The second insulating film 423 can be a high-k insulating film in this case. As shown in FIG. 8, a lower electrode layer 424A constituting a lower layer of a second electrode layer 424 is formed on the second insulating layer 423. The lower electrode layer 424A can be any of a polysilicon layer and any of a metal layer such as the W layer, the Pt layers or the Al layer in this case.

Figure 9:
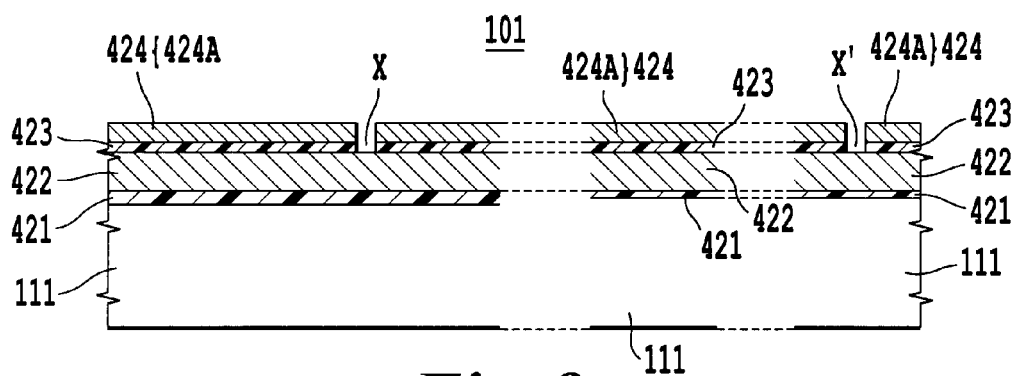
FIG. 9 is another manufacturing process diagram of the semiconductor device of the first embodiment.

As shown in FIG. 9, the opening X is formed on the lower electrode layer 424A and the second insulating film 423 in the transfer gate transistor region and the opening X' is formed on the lower electrode layer 424A and the second insulating film 423 in a capacitor element region, for example by lithography and etching. As shown in FIG. 9, the openings X and X' penetrate the lower electrode layer 424A and the second insulating film 423 and reach the first electrode layer 422.

Figure 10:
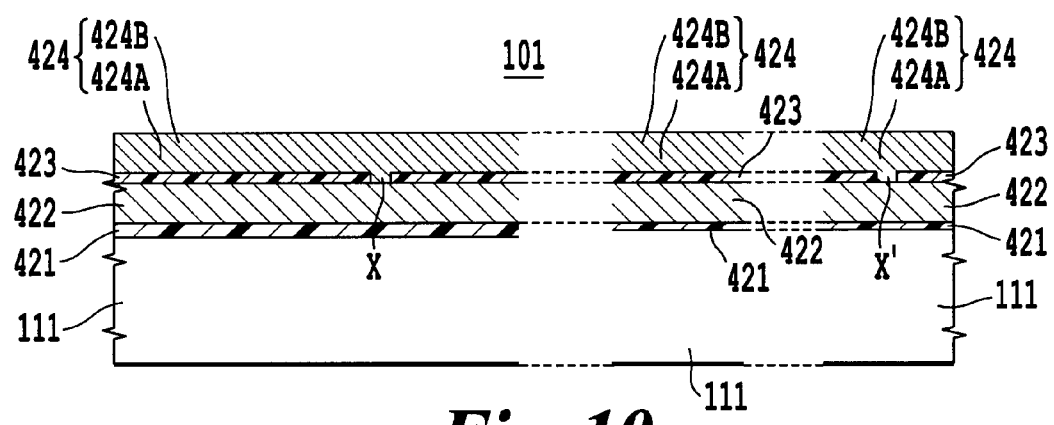
FIG. 10 is another manufacturing process diagram of the semiconductor device of the first embodiment.

As shown in FIG. 10, an upper electrode layer 424B constituting an upper layer of the second electrode layer 424 is formed on the lower electrode layer 424A having the openings X and X' formed therein. In this way, the second electrode layer 424 including the lower electrode layer 424A and the upper electrode layer 424B is formed. The upper electrode layer 424B can be any of a polysilicon layer and the metal layer such as the W layer, the Pt layer, or the Al layer in this case. Here, the upper electrode layer 424A and the lower electrode layer 424B can be made of a material having the same composition.

Figure 11:
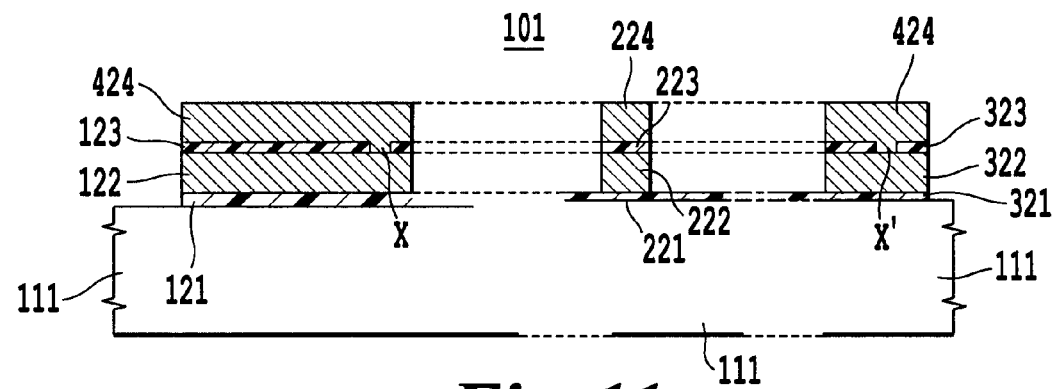
FIG. 11 is another manufacturing process diagram of the semiconductor device of the first embodiment.

As shown in FIG. 11, gate processing is executed in accordance with, for example, RIE and the like. In this way, the gate insulating film 121, the gate insulating film 221, and the lower insulating film 321 are formed by use of the first insulating film 421. The first gate electrode 122, the floating gate electrode 222, and the lower electrode 322 are formed by use of the first electrode layer 422. The intergate insulating film 123, the intergate insulating film 223, and the upper insulating film 323 are formed by use of the second insulating film 423. The control gate electrode 224 is formed by use of the second electrode layer 424.

Figure 12:
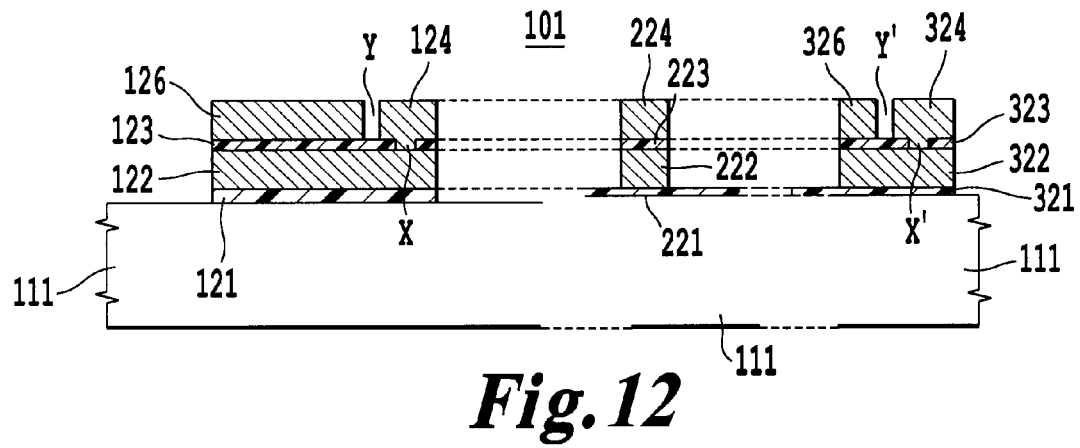
FIG. 12 is another manufacturing process diagram of the semiconductor device of the first embodiment.

As shown in FIG. 12, the groove Y is formed on the second electrode layer 424 in the transfer gate transistor region and the groove Y' is formed on the second electrode layer 424 in the capacitor element region by, for example, lithography and etching. In this way, the second gate electrode 124, the boost electrode 126, the lower connection electrode 324, and the upper electrode 326 are formed by use of the second electrode layer 424. The second gate electrode 124 is electrically connected to the first gate electrode 122 through the opening X. The boost electrode 126 is electrically insulated from the first gate electrode 122 by the intergate insulating film 123. The second gate electrode 124 and the boost electrode 126 are separated from each other by the groove Y. The lower connection electrode 324 is electrically connected to the lower electrode 322 through the opening X'. The upper electrode 326 is electrically insulated from the lower electrode 322 by the upper insulating film 323. The lower connection electrode 324 and the upper electrode 326 are separated from each other by the groove Y'.

Figure 13:
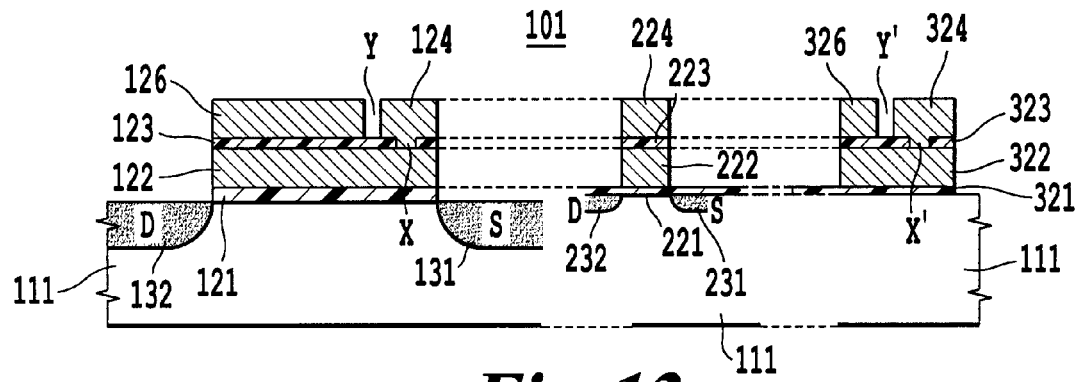
FIG. 13 is another manufacturing process diagram of the semiconductor device of the first embodiment.

As shown in FIG. 13, impurity ions are implanted into the substrate 111 by using the gate structure as a mask. In this way, the source and drain regions 131 and 132 are formed in the substrate 111 in the transfer gate transistor region, and the source and drain regions 231 and 232 are formed in the substrate 111 in a memory cell transistor region. Here, formation of source and drain regions in the capacitor element region is prevented by using a resist mask or the like.

Figure 14:
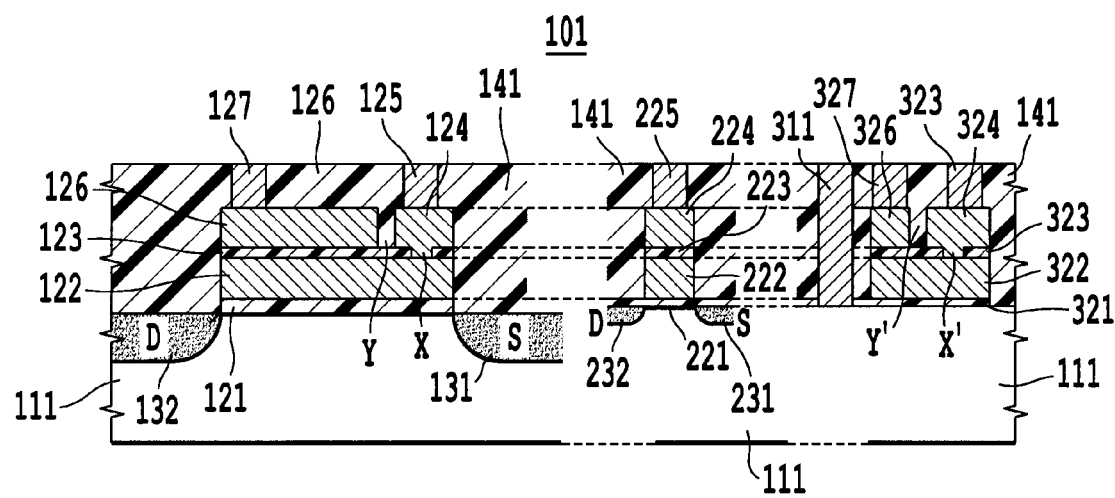
FIG. 14 is another manufacturing process diagram of the semiconductor device of the first embodiment.

As shown in FIG. 14, the interlayer insulating film 141 is deposited on the substrate 111 so as to embed the interlayer insulating film 141 into the grooves Y and Y'. In this way, the second gate electrode 124 and the boost electrode 126 are electrically insulated from each other and the lower connection electrode 324 and the upper electrode 326 are electrically insulated from each other. The interlayer insulating film 141 can be a silicon oxide film in this case. Then, the contact plugs 125, 127, 225, 311, 325, and 327 are formed as shown in FIG. 14.

Now, semiconductor devices 101 according to second and third exemplary embodiments will be described. The second and third exemplary embodiments are modified examples of the first embodiment. Accordingly, the second and third exemplary embodiments will mainly describe features that are different from the first embodiment.

In the first embodiment, the semiconductor device 101 is configured to increase the voltage at the first gate electrode 122 up to Vpp+α by applying the positive voltage α to the boost electrode 126. On the other hand, in the second embodiment, the semiconductor device 101 is configured to decrease the voltage at the first gate electrode 122 down to Vpp−α by applying a negative voltage −α to the boost electrode 126.

Now, the second embodiment will be described in detail.

Assuming a threshold voltage at a transistor is Vth, a source-drain voltage is Vds, and a source-gate voltage is Vgs, then these factors satisfy a relational expression of "Vds=Vgs−Vth" in a saturation region. The voltage to be transferred from the drain 132 to the source 131 of the transfer gate transistor is determined by this relational expression.

From the above-mentioned relational expression, it is apparent that a decrease in the voltage at the first gate electrode 122, that is, a decrease in Vgs, leads to a decrease in the voltage to be transferred to the source 131. Conventionally, it has been necessary to decrease the write voltage Vpp to decrease the voltage at the first gate electrode 122. For this reason, it has been necessary to use a charge pump circuit capable of generating various values of the write voltage Vpp to change the voltage at the first gate electrode 122 into various values.

In contrast, according to the second embodiment, it is possible to decrease the voltage at the first gate electrode 122 by applying a negative voltage to the boost electrode 126. For this reason, it is possible to change the voltage at the first gate electrode 122 into various values without using charge pump circuit that can generate various values of the write voltage Vpp. Therefore, according to the second embodiment, it is possible to simplify the circuit structure of the charge pump circuit.

The semiconductor device 101 of the second embodiment may also include both of a function to apply a positive voltage to the boost electrode 126 and a function to apply a negative voltage to the boost electrode 126.

Figure 15:
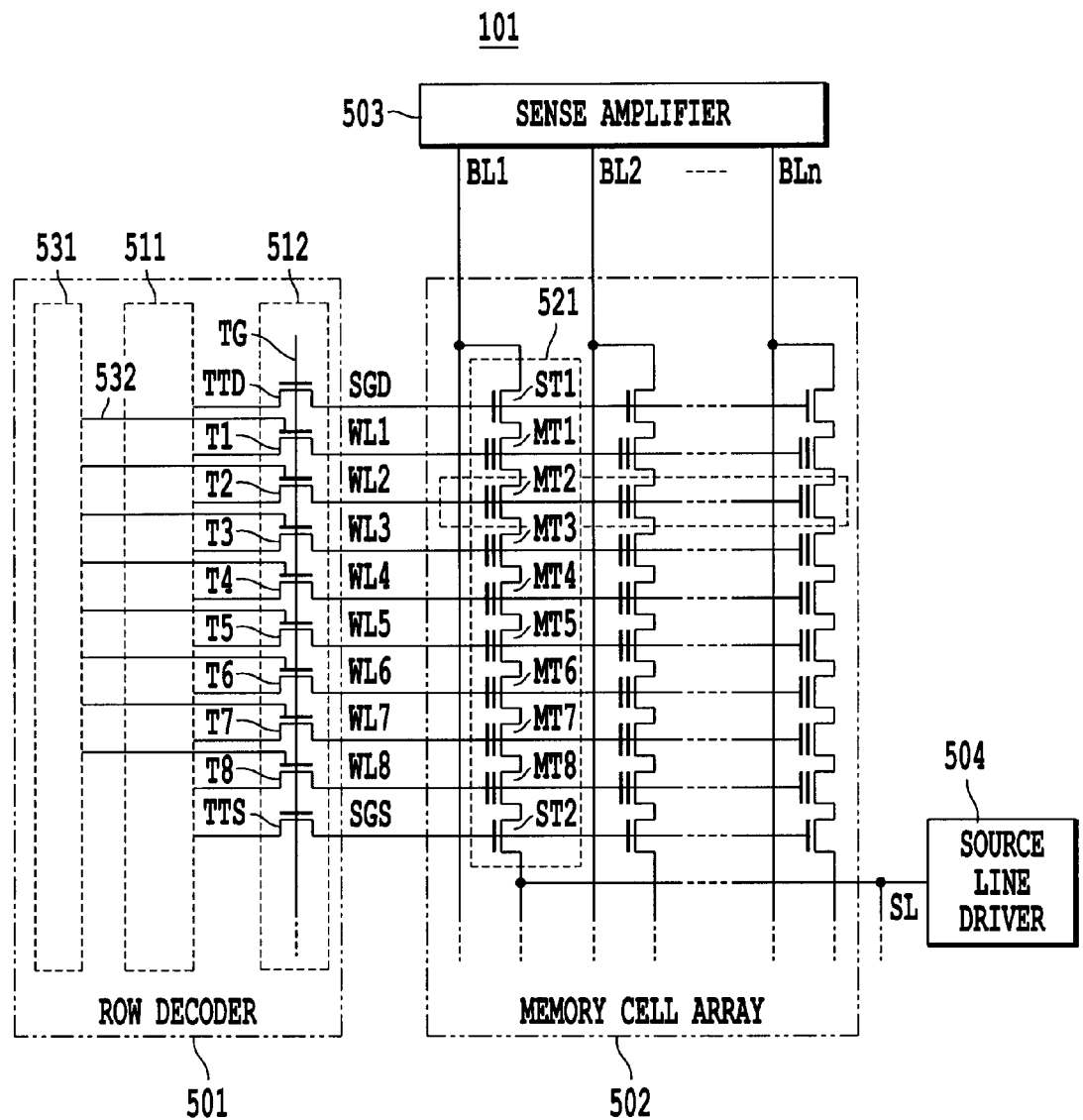
FIG. 15 is a diagram showing a circuit configuration example of the semiconductor device of FIG. 1.

FIG. 15 shows a circuit configuration example of the semiconductor device 101 of FIG. 1.

The semiconductor device 101 of this further third embodiment is a NAND-type flash memory that includes a row decoder 501, a memory cell array 502, a sense amplifier 503, and a source line driver 504.

The row decoder 501 is configured to select any one out of a selection gate line SGD, word lines WL1 to WL8, and a selection gate line SGS. The row decoder 501 includes a row main-decoder circuit unit 511 and a row sub-decoder unit 512. The row main-decoder circuit unit 511 decodes a row address signal and transmits the decoded row address signal to the row sub-decoder circuit unit 512. The row sub-decoder circuit unit 512 includes a transfer gate transistor TTD connected to the selection gate line SGD, high voltage type transistors T1 to T8 respectively connected to the word lines WL1 to WL8, and a transfer gate transistor TTS connected to the selection gate line SGS. Gates of these transistors are connected to a transfer gate line TG. Each of the high voltage type transistors T1 to T8 corresponds to the transfer gate transistor of FIG. 1. Here, the second gate electrode 124 is connected to the transfer gate line TG and the source and drain regions 131 and 132 are connected to row sub-decoder circuit unit 512 (such as the node N4 in FIG. 6 or FIG. 7) and the corresponding word line WL, respectively. Meanwhile, the boost electrode 126 is connected to a boost electrode control circuit 531 by a boost connecting line 532.

The memory cell array 502 includes multiple NAND cells 521 that are arranged in a matrix fashion. Each of the NAND cells 521 includes two selection transistors ST1 and ST2 and eight memory cell transistors MT1 to MT8. Each of the memory cell transistors MT1 to MT8 corresponds to the memory cell transistor in FIG. 4. The number of memory cell transistors that constitute each of the NAND cells 521 may be other than 8 transistors (such as 16 transistors or 32 transistors). Meanwhile, the number of the selection transistors constituting each of the NAND cells 521 may be reduced to a single selection transistor as long as it is possible to select the corresponding NAND cell 521 by use of that single selection transistor.

The row decoder 501 is connected to the memory cell array 502 by use of the selection gate lines SGD and SGS and the word lines WL1 to WL8. Gates of the selection transistors ST1 and ST2 are connected to the selection gate lines SGD and SGS, respectively. Gates of the memory cell transistors MT1 to MT8 are respectively connected to the word lines WL1 to WL8.

A drain of the selection transistor ST1 of each of the NAND cells 521 is connected to any of bit lines BL1 to BLn. The bit lines BL1 to BLn are connected to the sense amplifier 503. The sense amplifier 503 is configured to amplify data read out of the selected memory cell transistor.

A source of the selection transistor ST2 of each of the NAND cells 521 is connected to a source line SL. The source line SL is connected to the source line driver 504. The source line driver 504 is configured to apply a voltage to the source line SL.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor device comprising: a semiconductor substrate; a first gate insulating film formed on the substrate;

a first gate electrode formed on the first gate insulating film; source and drain regions formed in the substrate so as to sandwich the first gate electrode; a first intergate insulating film formed on the first gate electrode and including a first opening; a second gate electrode formed on the first intergate insulating film and electrically connected to the first gate electrode through the first opening; and a boost electrode formed on the first intergate insulating film and electrically isolated from the first gate electrode and the second gate electrode; wherein the source and drain regions are respectively connected to a word line and a row main decoder circuit unit, the second gate electrode is connected to a transfer gate line, and the boost electrode is connected to a boost electrode control circuit.

2. The semiconductor device according to claim 1, wherein the second gate electrode and the boost electrode are separated from each other by a groove formed between the second gate electrode, and the boost electrode and are electrically insulated from each other by an insulating film embedded in the groove.

3. The semiconductor device according to claim 2,
wherein the second gate electrode is formed on a corner on the first gate electrode, and
the second gate electrode is surrounded on two sides thereof by the groove.

4. The semiconductor device according to claim 1, further comprising:
a memory cell including:
a second gate insulating film formed on the substrate;
a floating gate electrode formed on the second date insulating film;
a second intergate insulating film formed on the floating gate electrode; and
a control gate electrode formed on the second intergate insulating film,
wherein the floating gate electrode is a same material as the first gate electrode, and
the control gate electrode is a same material as the second gate electrode and the boost electrode.

5. The semiconductor device according to claim 1, further comprising:
a capacitor element including:
a lower insulating film formed on the substrate;
a lower electrode formed on the lower insulating film;
an upper insulating film formed on the lower electrode;
a lower connection electrode formed on the upper insulating film and connected to the lower electrode through a second opening; and
an upper electrode formed on the upper insulating film and electrically insulated from the lower connection electrode,
wherein the lower electrode is a same material as the first gate electrode, and
the lower connection electrode is a same material as the upper electrode, the second gate electrode, and the boost electrode.

6. The semiconductor device according to claim 1, further comprising:
a device isolation region,
wherein the second gate electrode is formed only on the device isolation region.

7. The semiconductor device according to claim 1,
wherein the semiconductor device is configured to perform operations of:
applying a first voltage to the second gate electrode;
disconnecting the second gate electrode from a power source after applying the first voltage; and
applying a second voltage to the boost electrode so as to change a voltage at the first gate electrode to a third voltage equivalent to a sum of the first voltage and the second voltage while the second gate electrode is kept disconnected from the power source.

8. The semiconductor device according to claim 7, wherein the second voltage is either of a positive voltage or a negative voltage.

9. The semiconductor device according to claim 1, further comprising:
a row main decoder including an input terminal, a first inverter, a second inverter, a first transistor, and a second transistor connected in series,
wherein the second gate electrode is connected to the second transistor.

10. The semiconductor device according to claim 7, further comprising:
a row main decoder including an input terminal, a first inverter, a second inverter, a first transistor, and a second transistor connected in series,
wherein the second gate electrode is connected to the second transistor.

11. The semiconductor device according to claim 10, wherein the operation of disconnecting the second gate electrode from the power source after applying the first voltage is performed by applying a negative voltage to gate electrodes of the first transistor and the second transistor.

12. The semiconductor device according to claim 10, wherein the operation of disconnecting the second gate electrode from the power source after applying the first voltage is performed by applying a positive voltage to wells of the first transistor and the second transistor.

13. The semiconductor device according to claim 10, further comprising:
a third transistor located between the second inverter and the first transistor,
wherein the operation of disconnecting the second gate electrode from the power source after applying the first voltage is performed by applying 0 V to a gate electrode of the third transistor.

14. The semiconductor device according to claim 13, wherein the third transistor is an enhancement type transistor.

15. The semiconductor device according to claim 1, wherein the row main decoder circuit unit includes a circuit configured of a first inverter, a second inverter, a first transistor, and a second transistor connected in series, and the source and drain regions are connected to the second transistor.

16. The semiconductor device according to claim 5, wherein a film thickness of the first gate insulating film is larger than a film thickness of the lower insulating film.

17. The semiconductor device according to claim 2, wherein the groove is formed in a shape of a straight line.

* * * * *